United States Patent [19]
Shimada

[11] Patent Number: 5,631,502
[45] Date of Patent: May 20, 1997

[54] MULTI-CHIP MODULE

[75] Inventor: Osamu Shimada, Kanagawa-ken, Japan

[73] Assignee: Kabushiki Kaisha Toshiba, Kanagawa-ken, Japan

[21] Appl. No.: 205,542

[22] Filed: Mar. 4, 1994

[30] Foreign Application Priority Data

Mar. 15, 1993 [JP] Japan .................................. 5-054275

[51] Int. Cl.$^6$ .............................. H01L 23/58; H01L 23/52
[52] U.S. Cl. ............................ 307/43; 257/48; 257/691; 307/147
[58] Field of Search ...................... 307/43, 147; 257/691, 257/698, 48, 401, 723, 786, 787

[56] References Cited

U.S. PATENT DOCUMENTS

| | | | |
|---|---|---|---|
| 4,884,122 | 11/1989 | Eichelberger et al. | 257/48 |
| 4,930,002 | 5/1990 | Takenaka et al. | 257/698 |
| 5,231,300 | 7/1993 | Terashima et al. | 257/691 |
| 5,272,600 | 12/1993 | Carey | 361/792 |
| 5,347,160 | 9/1994 | Sutrina | 257/698 |
| 5,393,991 | 2/1995 | Kawakami | 257/48 |

*Primary Examiner*—David S. Martin
*Assistant Examiner*—Jonathan S. Kaplan
*Attorney, Agent, or Firm*—Finnegan, Henderson, Farabow, Garrett & Dunner, L.L.P.

[57] ABSTRACT

A second power supply line 5 and a second ground line 6 are disposed along with a first power supply line 1 and a first ground line 2. An inner line 4 which connects a semiconductor chip IC1 and a semiconductor chip IC2 is connected to a second power supply line 5 and a second ground line 6 through respective resistors R1 and R2. The second power supply line 5 and the second ground line 6 are connected to outer terminals 15 and 16, not directly to the semiconductor chips IC1 and IC2, respectively.

53 Claims, 14 Drawing Sheets

MULTI-CHIP MODULE

BACKGROUND OF THE INVENTION

1. Field of the Invention

The present invention relates to a multi-chip module having a multilayer wiring substrate on which a plurality of semiconductor chips are mounted.

2. Description of the Related Art

In recent years, electronic devices and electronic circuits are becoming smaller and their integration density is being increased. For example, semiconductor devices which are packaged are mounted on a printed wiring board. However, since conventional mounting methods are limited when there is a high integration density, multi-chip modules where a plurality of semiconductor devices (semiconductor chips) are directly mounted on a multilayer substate have been developed.

In the multi-chip modules, types of wiring lines which construct a multilayer substrate can be functionally categorized as follows:

(1) a power supply line through which power is supplied to semiconductor devices, (2) a ground line, (3) input and output lines from and to which signals are input and output to the outside of the module, respectively, and (4) inner lines which connect mounted semiconductor devices mounted.

FIG. 14 is a circuit diagram showing an outlined construction of a conventional multi-chip module. In this drawing, reference symbols IC1 and IC2 are semiconductor chips; reference symbols R1 and R2 are resistors; reference numerals 1 to 4 are wiring lines; and reference numerals 11 to 13 are outer terminals.

An outer terminal 11 is a power supply terminal connected to a power supply. A power supply line 1 is connected to the power supply terminal 11.

An outer terminal 12 is a ground terminal connected to a ground of the module. A ground line 2 is connected to the ground terminal 12.

An outer terminal 13 is a signal terminal to which a signal is input. An input/output line 3 is connected to a signal terminal 13.

A line 4 is an inner line which connects the semiconductor chip IC1 and IC2.

In such a conventional multi-chip module, as a first case, the inner line 4 may be connected to the ground line 2 through the resister R2. As a second case, the inner line 4 may be connected to the power supply line 1 through the resistor R1.

In the first case, signals are processed at high speed and inner lines are treated as transmission lines so as to control characteristic impedance. In this case, depending on an input ON resistance of the input side semiconductor chip IC2 and other conditions. The inner line 4 is connected to the ground line 2 through the resister R2. For example, when the inner line 4 has a characteristic impedance of 50 Ω, a resister R2 with a resistance of 50 Ω which serves as a termination resistor is connected between the inner line 4 and the ground line 2.

In the second case, an output of a particular type of semiconductor chip is connected to an input of another type of semiconductor chip by the inner line 4. For example, an output side semiconductor chip IC1 is of TTL (Transistor to Transistor Logic) type, while an input side semiconductor chip IC2 is of CMOS (Complementary Metal Oxide Semiconductor) type. Since output level of the TTL type semiconductor chip is lower than the level necessary for the CMOS type semiconductor chip, the inner line 4 is connected to the power supply line 1 through the resistor R1 and to the ground line 2 through the resister R2. Thus, the input level necessary for the CMOS type semiconductor chip IC2 is obtained.

As described above, in the conventional multi-chip module, inner lines are occasionally connected to a power supply line and a ground line through respective resisters.

Generally, in a fabrication process for semiconductor devices, before they are shipped, a so-called burn-in test is performed for them in such a way that they are operated for a predetermined period of time under severer conditions than that with which they are normally operated and semiconductor devices where detected defects are discarded. However, in the case of the multi-chip modules, it is difficult to perform such a burn-in test for semiconductor chips which are not packaged (namely, bare chips). Thus, in this case, after semiconductor chips are mounted on a multilayer case, and then packaged, the burn-in test is performed for them.

However, in the conventional multi-chip modules, the inner chips cannot be directly accessed from the outside. In other words, as shown in FIG. 15, when a burn-in test is performed, the signal level of an inner line which cannot be accessed from the outside becomes lower than the level of the power voltage due to an ON resistance and an OFF resistance of the output side semiconductor chip. Since the input side semiconductor chip cannot be activated, initial defects thereof cannot be completely removed.

SUMMARY OF THE INVENTION

An object of the present invention is to provide a multi-chip module where desired voltages can be set to inner lines thereof so that a burn-in test can be performed in a modular manner.

The present invention is a multi-chip module, comprising a multilayer substrate; and at least a first semiconductor chip and a second semiconductor chip mounted on the multilayer substrate, wherein the multilayer substrate comprises, a first power supply line for supplying a first power to the first and second semiconductor chips, a ground line for applying a ground voltage to the first and second semiconductor chips, a plurality of inner lines for connecting an output terminal or an input terminal of the first semiconductor chip to an input terminal or an output terminal of the second semiconductor chip, and a second power supply line connected to at least one of the inner lines through a resistor and adapted for supplying a second power to the first semiconductor chip or the second semiconductor chip through the inner line and the resistor.

The present invention is a multi-chip module, further comprising at least a second power supply line and a second ground line which is connected to the inner line through a resister.

Thus, the inner lines can be directly accessed through the second power supply line and the second ground line. By setting desired voltages to the inner lines, a burn-in test can be securely performed for semiconductor devices in a module state.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

Figure 1:
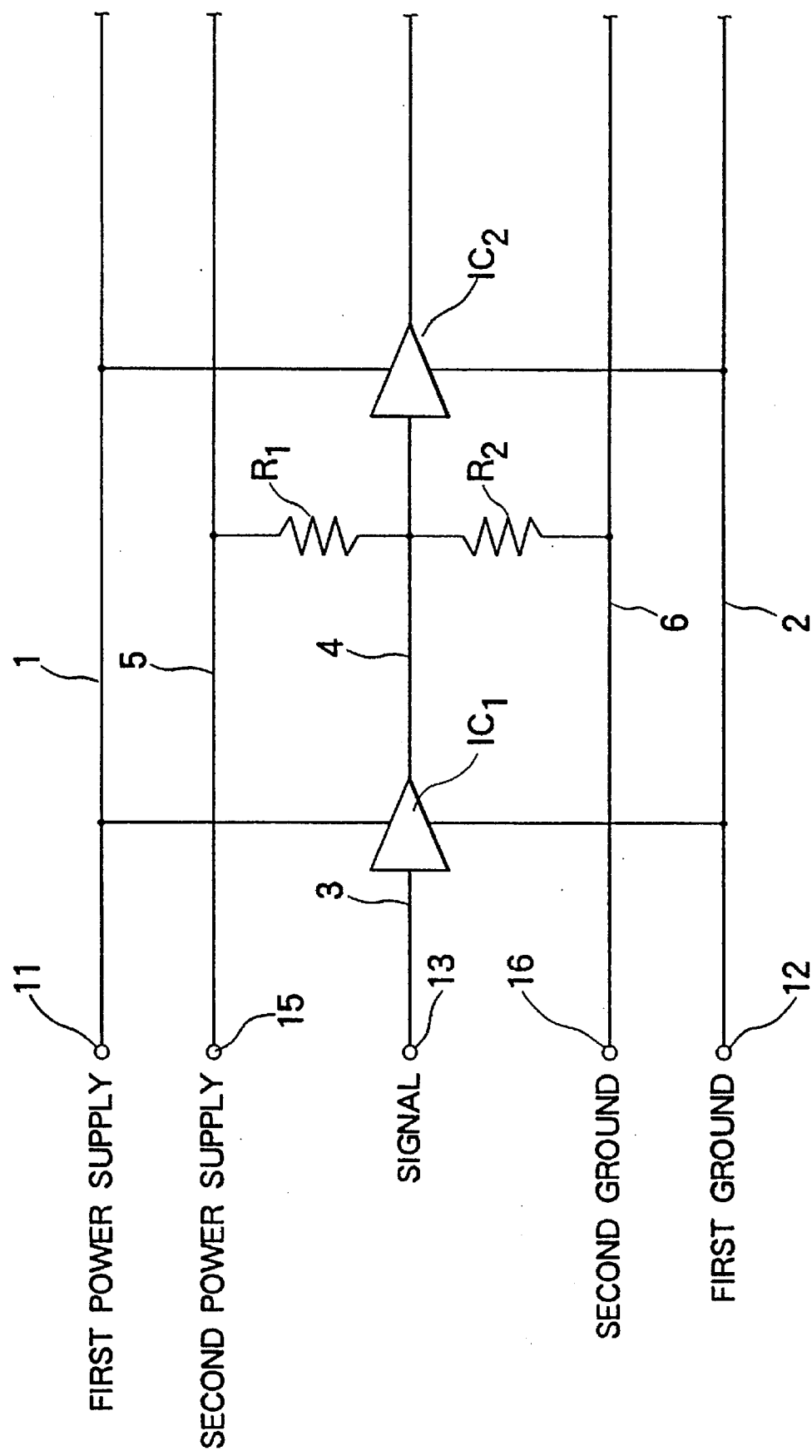
FIG. 1 is a circuit diagram of a principal portion of a multi-chip module according to an embodiment of the present invention.
Figure 2:
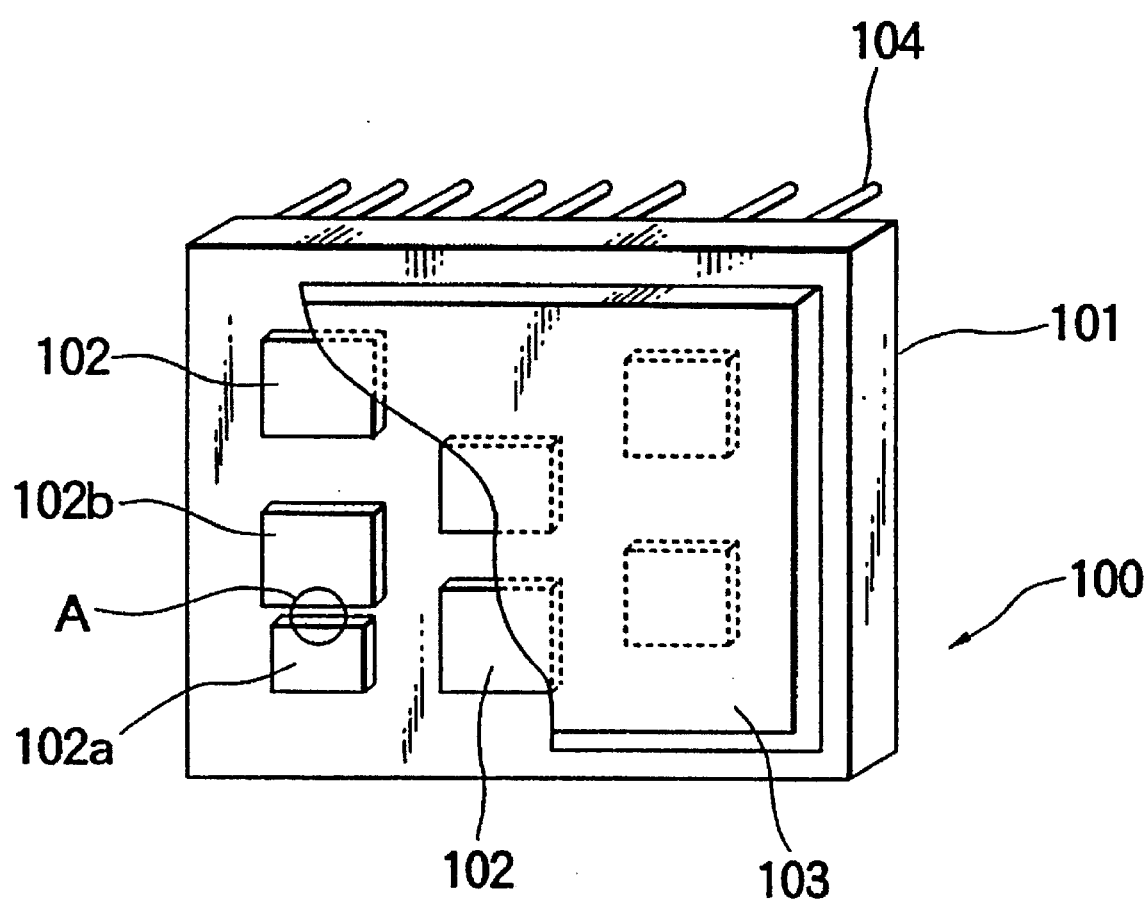
FIG. 2 is a perspective view showing the multi-chip module of FIG. 1.

FIGS. 1 and 2 show a construction of a multi-chip module according to a first embodiment of the present invention. As shown in FIG. 2, a multi-chip module 100 comprises a multilayer substrate 101, a plurality of semiconductor chips 102, a lid (sealing cap) 103, and a plurality of outer I/O pins 104. The semiconductor chips 102 are mounted on the multilayer substrate 101. The semiconductor chips 102 are covered with the lid 103. The outer I/O pins 104 which serve as outer terminals are disposed on the rear surface of the multilayer substrate 101 at a predetermined pitch.

Figure 14:
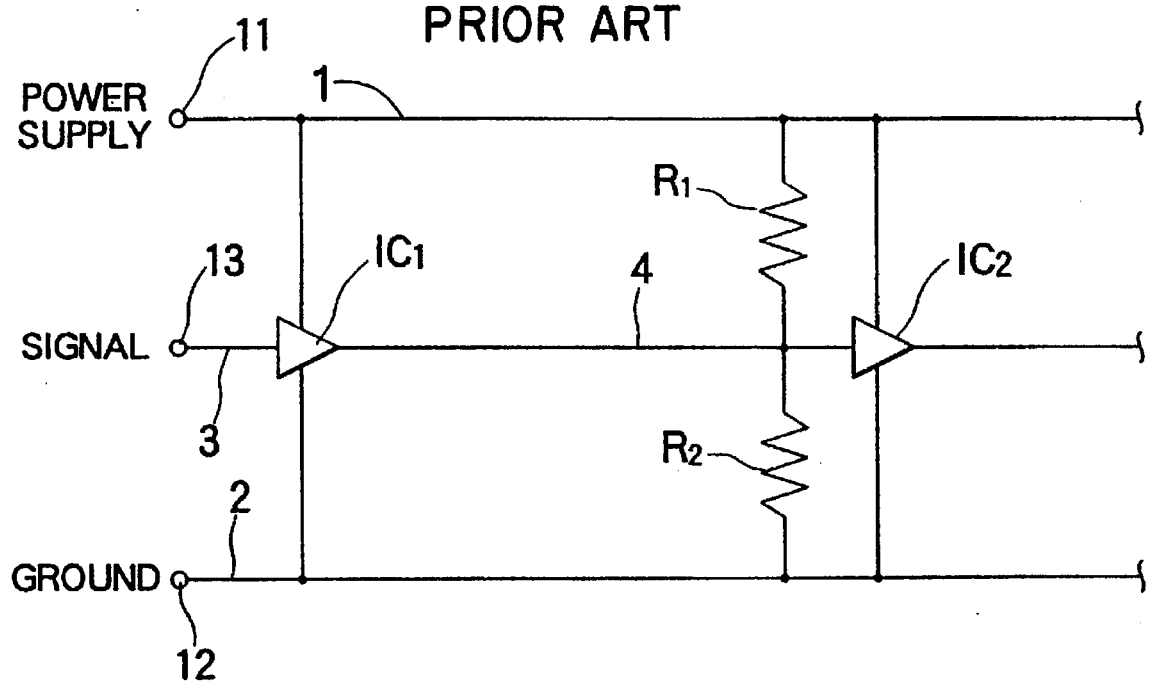
FIG. 14 is a circuit diagram showing a principal portion of a conventional multi-chip module.
Figure 15:
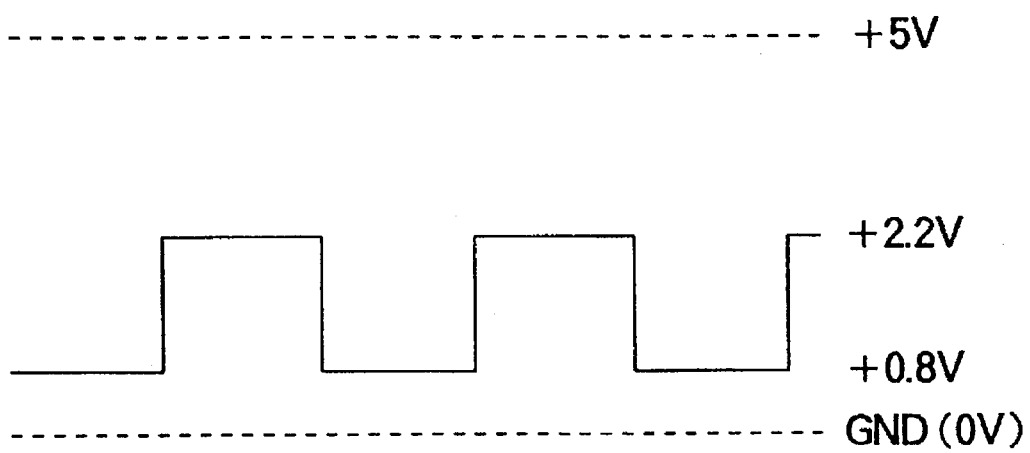
FIG. 15 is a schematic diagram showing signal levels in a burn-in test for a conventional multi-chip module.

FIG. 1 also schematically shows a circuit construction of the multi-chip module of this embodiment. In FIG. 1, the same reference symbols and numerals are used for portions corresponding to the conventional multi-chip module shown in FIG. 14.

As shown in FIG. 1, the multi-chip module has a power supply line (hereinafter referred to as a first power supply line) 1, a ground line (hereinafter referred to as a first ground line) 2, and a second power supply line 5, and a second ground line 6. The first power supply line serves to supply power to semiconductor chips IC1 and IC2 in a normal operation state of the multi-chip module. An inner line 4 connects the semiconductor chip IC1 and the semiconductor chip IC2. The inner line 4 is connected to the second power supply line 5 through a resistor R1. In addition, the inner line 4 is connected to the second ground line 6 through a resistor R2. The second power supply line 5 and the second ground line 6 are connected to outer terminals 15 and 16, not directly connected to the semiconductor chips IC1 and IC2, respectively. The outer terminals 15 and 16 are connected to corresponding outer I/O pins 104 as shown in FIG. 2.

The resistances of the resistors R1 and R2 can be easily calculated with an ON resistance, an output current, and an output voltage (the voltage of the first power supply line 1) of an output buffer of the semiconductor chip IC1 and an input resistance of the semiconductor chip IC2. The resistances of the resistors R1 and R2 are preferably in the range from 1 kΩ to 10 kΩ.

Next, a more practical construction of the multi-chip module 100 according to the embodiment will be described.

Figure 3:
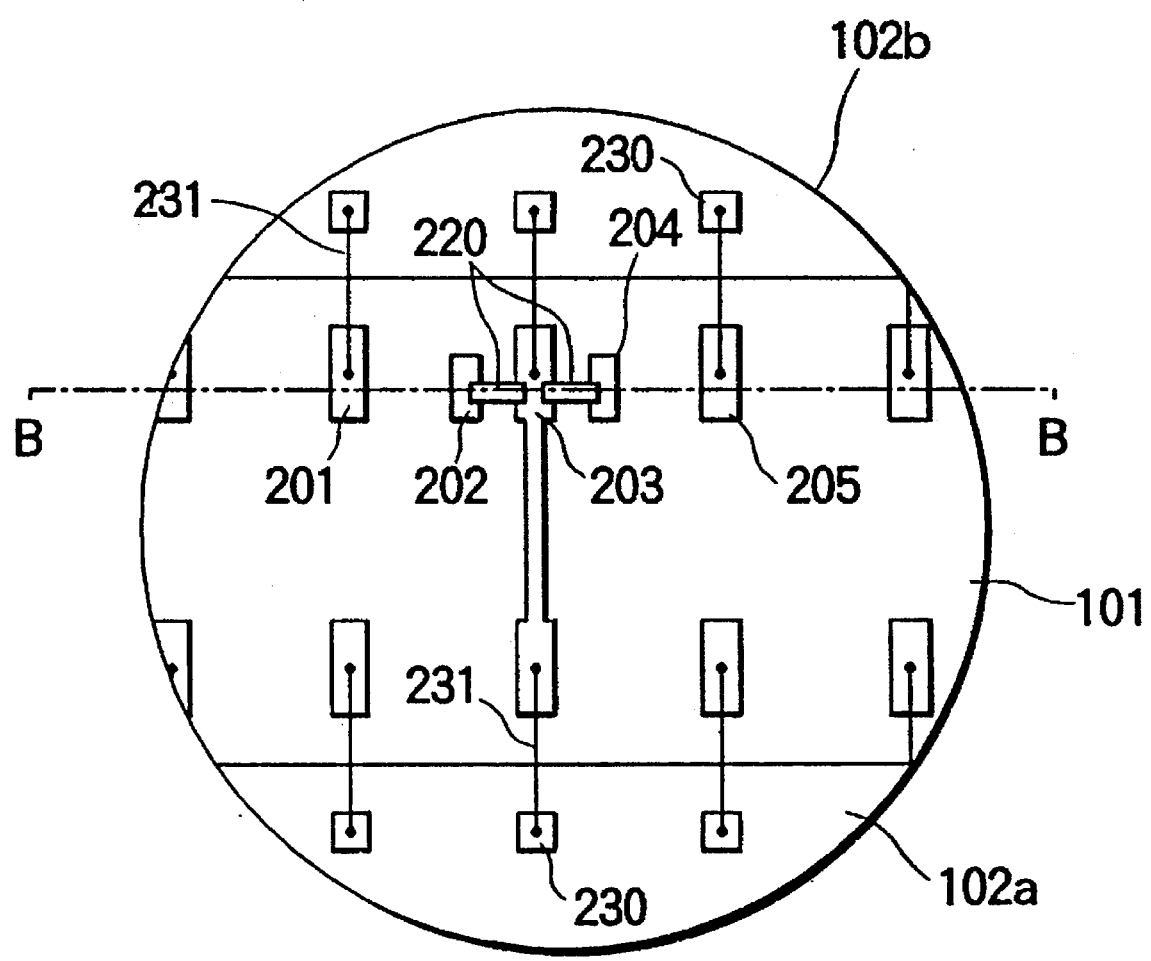
FIG. 3 is an enlarged top view of a portion A of FIG. 2.
Figure 4:
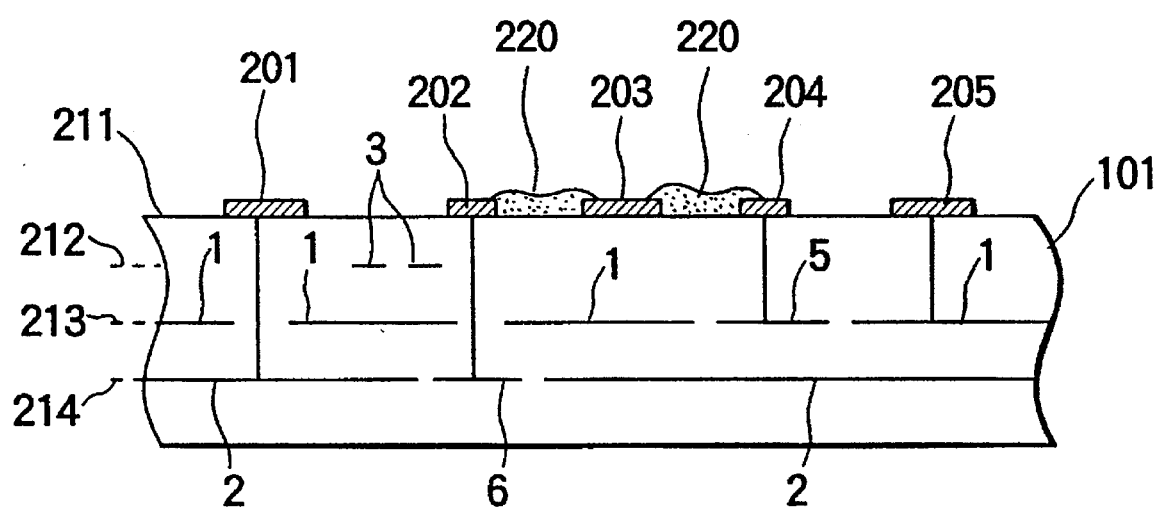
FIG. 4 is a sectional view taken along line B—B of FIG. 3.

FIG. 3 is an enlarged view of a portion A of FIG. 2, the portion including semiconductor chips 102a and 102b and members which are disposed therebetween. FIG. 4 is a sectional view taken along line B—B of FIG. 3, which shows a cross section along electrode pads 201 to 205 disposed on the multilayer substrate 101.

Figure 6:
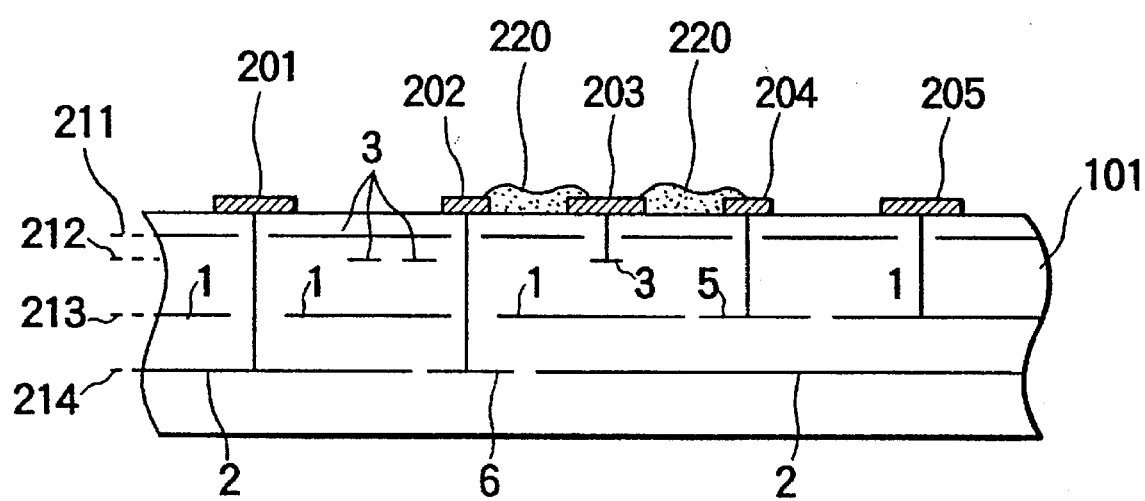
FIG. 6 is a sectional view showing a multi-tip module according to another embodiment of the present invention.

As shown in FIG. 4, the multilayer substrate 101 is constructed of four layers which are a Y signal layer 211, an X signal layer 212, a power supply layer 213, and a ground layer 214 which are layered in this order. The Y signal layer 211 is the top layer, whereas the ground layer 214 is the bottom layer. As shown in FIG. 6, the multilayer substrate 101 may be constructed of five layers where the Y signal layer 211 is disposed in the multilayer substrate 101, rather than on the surface thereof. In addition, multilayer substrate 101 may be constructed of six or more layers.

As shown in FIG. 4, the power supply layer 213 has a first power supply line 1 and a second power supply line 5. The ground layer 214 has a first ground line 2 and a second ground line 6. The first ground line 2 is connected to the electrode pad 201. The second ground line 6 is connected to the electrode pad 202. The second power supply line 5 is connected to the electrode pad 204. The first electrode line 1 is connected to the electrode pad 205. The electrode pad 203 is electrically connected to the electrode pads 202 and 204 through respective thick film resistors 220 (which are made of for example RuOz). The thick film resistors 220 are equivalent to the resistors R1 and R2 shown in FIG. 1. The semiconductor chips 102a and 102b are equivalent to the semiconductor chips IC1 and IC2 (shown in FIG. 1), respectively.

In FIG. 3, reference numeral 230 represents I/O pads disposed on the semiconductor chips 102a and 102b. Reference numerals 231 represents bonding wires which connect the I/O pads 230 to the electrode pads 201 to 205 disposed on the multilayer substrate 101. The bonding wires 213 are made of Au or the like.

When a burn-in test is performed for the multi-chip module 100 according to the embodiment, as shown in FIG. 1, the first power supply line 1 is connected to the first power supply; the second power supply line 5 is connected to the second power supply; the first ground line 2 is connected to the first ground; and the second ground line 6 is connected to the second ground. In addition, the voltage of the second power supply line 5 is set to a higher voltage than that of the first power supply line 1. The voltage of the second ground line 6 is set to a lower voltage than that of the first ground line 2.

Figure 5:
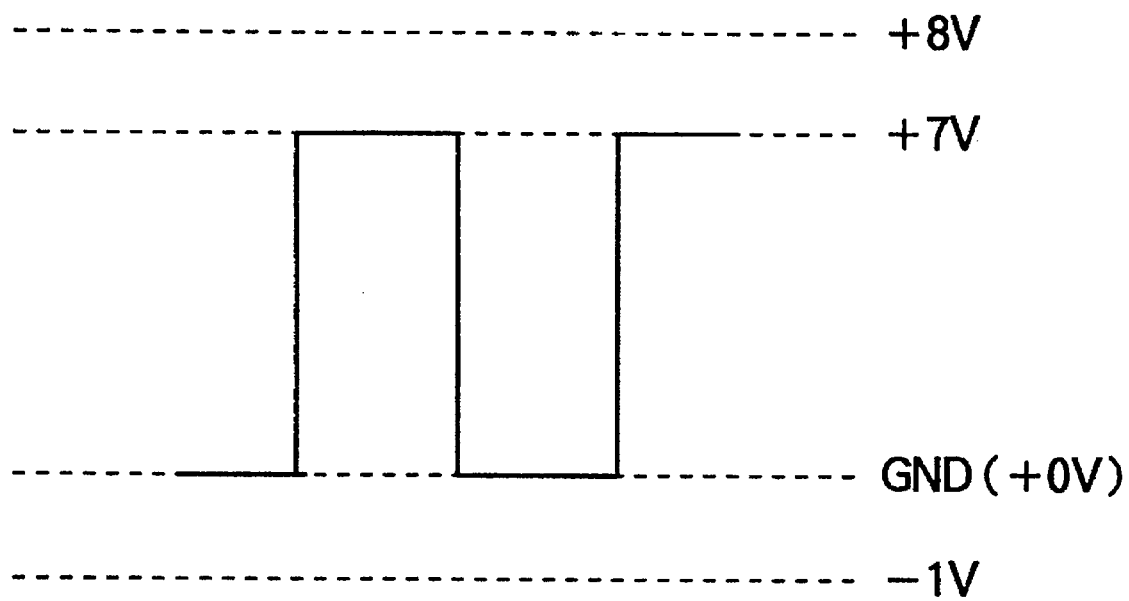
FIG. 5 is a schematic diagram showing signal levels in a burn-in test of the multi-chip module of FIG. 1.

For example, when the semiconductor chips IC1, IC2, and the like operate at a voltage of 5 V (in the range from 0 to 5 V), as shown in FIG. 5, a burn-in test is performed in such a way that a voltage of 7 V is applied to the first power supply line 1; a voltage of 0 V is applied to the first ground line 2; a voltage of 8 V is applied to the second power supply line 5; and a voltage of −1 V is applied to the second ground line 6. Thus, since the same voltages of signals and the same voltages of power supplies are supplied to each of the semiconductor chips, the voltage of a signal sent to for example the semiconductor chip IC2 is properly raised. Consequently, a burn-in test can be performed with high reliability.

In addition, since the voltages of the second power supply line 5 and the second ground line 6 can be set to desired levels, if power is supplied to the first power supply line 1 and the second power supply line 5 which are connected and if the first ground line 2 and the second ground line 6 are grounded while they are connected, a signal can be sent from a TTL type semiconductor chip to a CMOS type semiconductor chip.

Moreover, the multi-chip module according to this embodiment can be also used as a termination resistor which reduces reflection of signals in a semiconductor chip which processes them at high speed.

Figure 7:
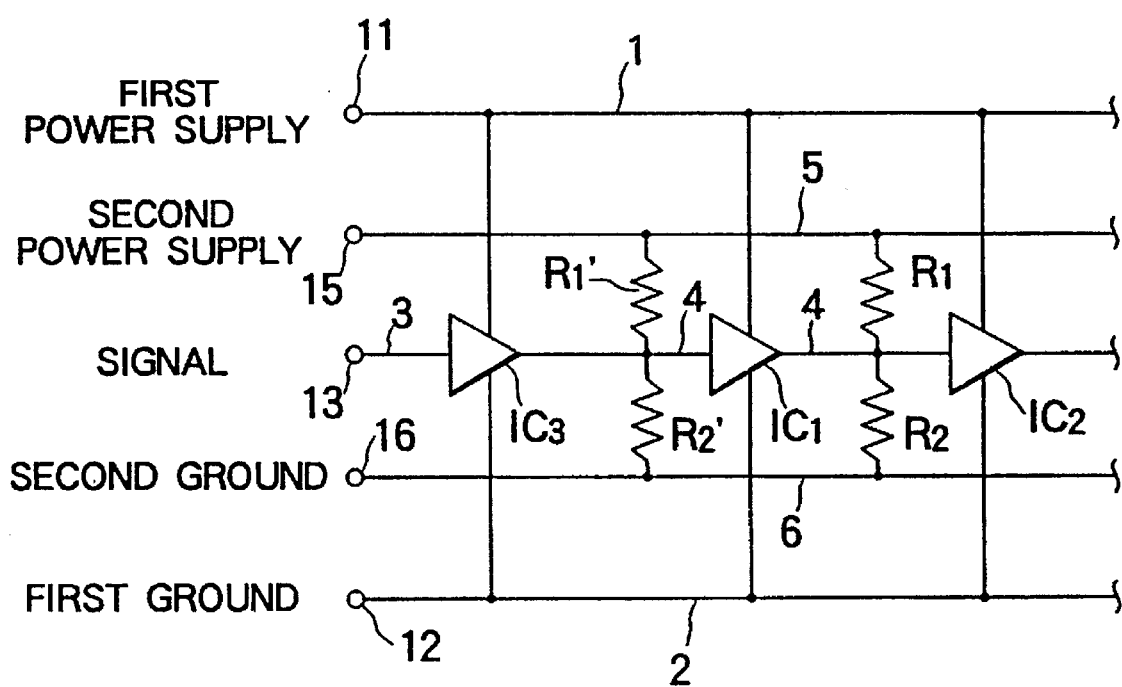
FIG. 7 is a circuit diagram of a principal portion of another embodiment of the present invention.

As shown in FIG. 1, in the above-described embodiment, the input line of the first semiconductor chip IC1 is connected to the outer connection terminal 13. However, as shown in FIG. 7, the input line of the first semiconductor chip IC1 may be the inner line 4 connected to the semiconductor chip IC3. In this case, the inner line 4 which is the input line of the semiconductor chip IC1 is preferably connected to the second power supply line 5 and the second ground line 6 through the respective resistors R1' and R2'.

Figure 8:
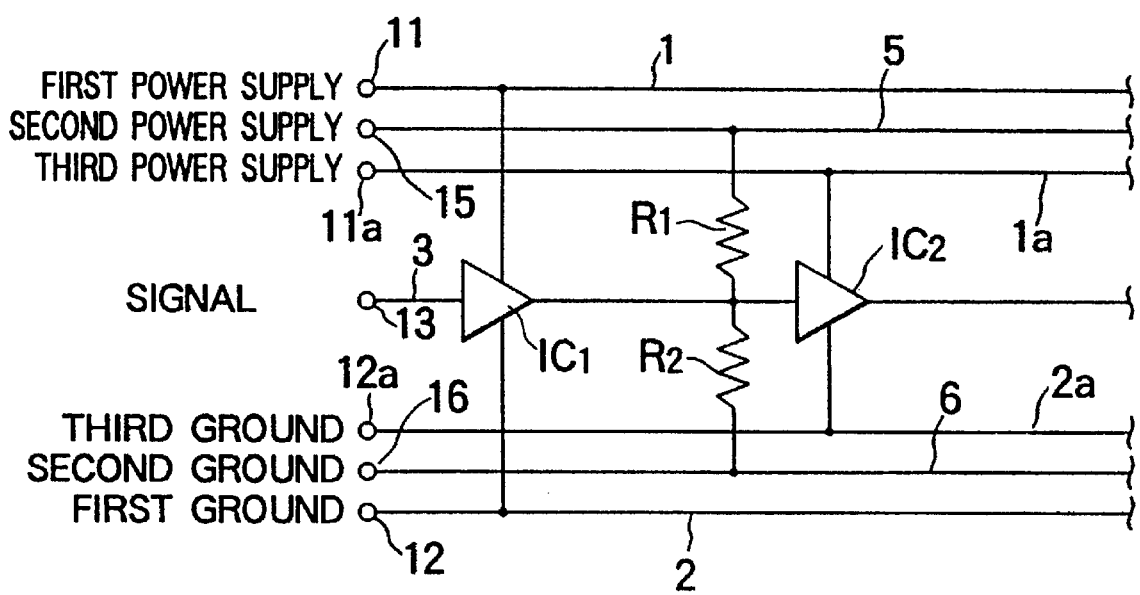
FIG. 8 is a circuit diagram showing a principal portion of another embodiment of the present invention.

As shown in FIG. 1, in the above-described embodiment, the first power supply line and the first ground line are connected to each of the first semiconductor chip IC1 and the second semiconductor chip IC2. However, as shown in FIG. 8, the first power supply line 1 and the first ground line 2 are connected to the first semiconductor chip IC1, whereas a third power supply line 1 and a third ground line 2a may be connected to the second semiconductor chip IC2. In this case, the third power supply line 1a is connected to an outer terminal 11a, whereas the third ground line 2a is connected to an outer terminal 12a.

Figure 9:
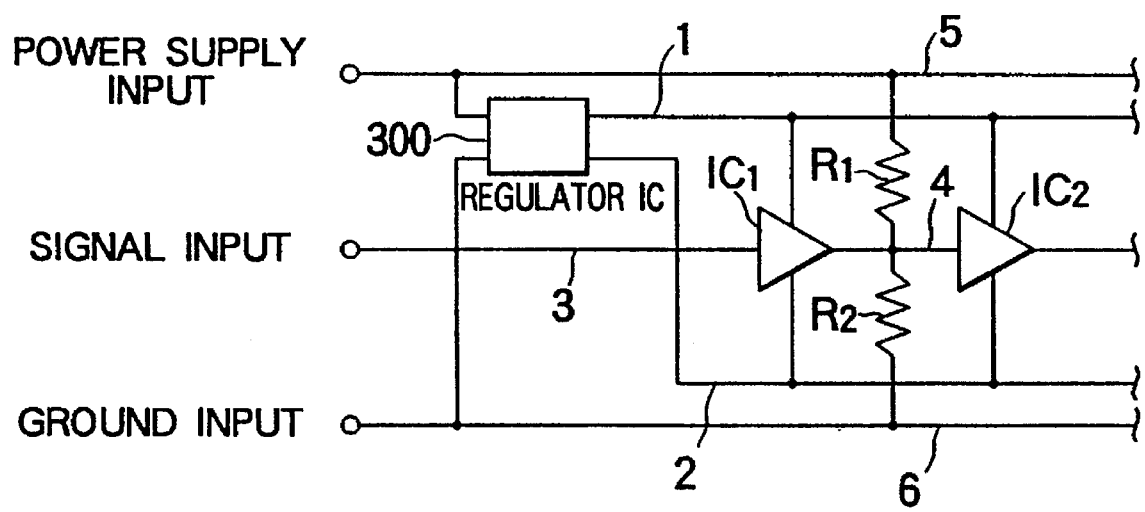
FIG. 9 is a circuit diagram showing a principal portion of another embodiment of the present invention.

The first power supply line 1 and the first ground line 2 which are connected to the first semiconductor chip IC1 or the second semiconductor chip IC2 may not be connected directly to respective outer connection terminals. In other words, as shown in FIG. 9, a regulator IC 300 which applies a power supply voltage and a ground voltage may be disposed in the multi-chip module and the first power supply line and the ground line may be connected to a power supply output terminal and a ground output terminal which are output terminals of the regulator IC 300.

Figure 10:
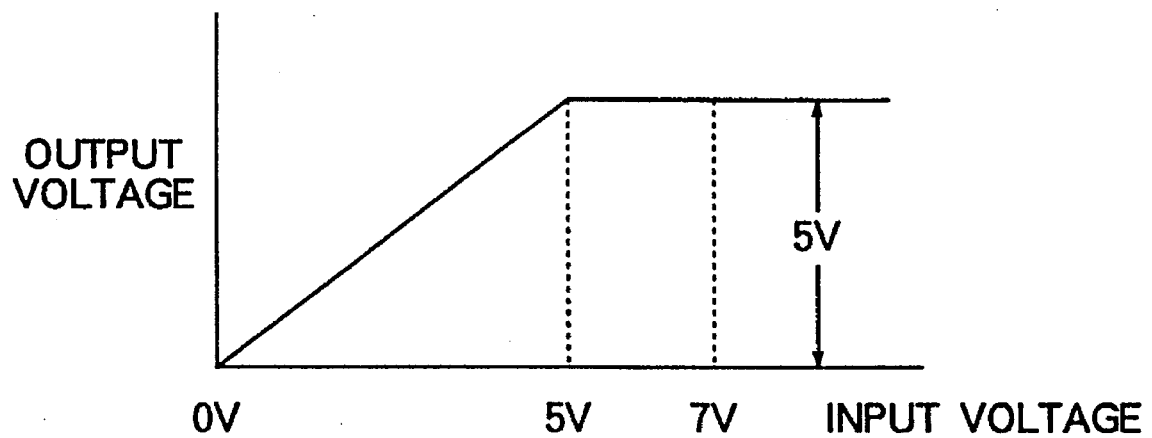
FIG. 10 is a graph showing an operational characteristic of a regulator IC.

FIG. 10 shows an operational characteristic of a conventional regulator IC. With such a regulator IC, when power supply voltages +7 V and 0 V are applied, voltages +5 V and 0 V can be applied to the semiconductor chips IC1 and IC2.

In this construction, the number of input terminals for the power supplies and the grounds can be reduced.

Figure 11:
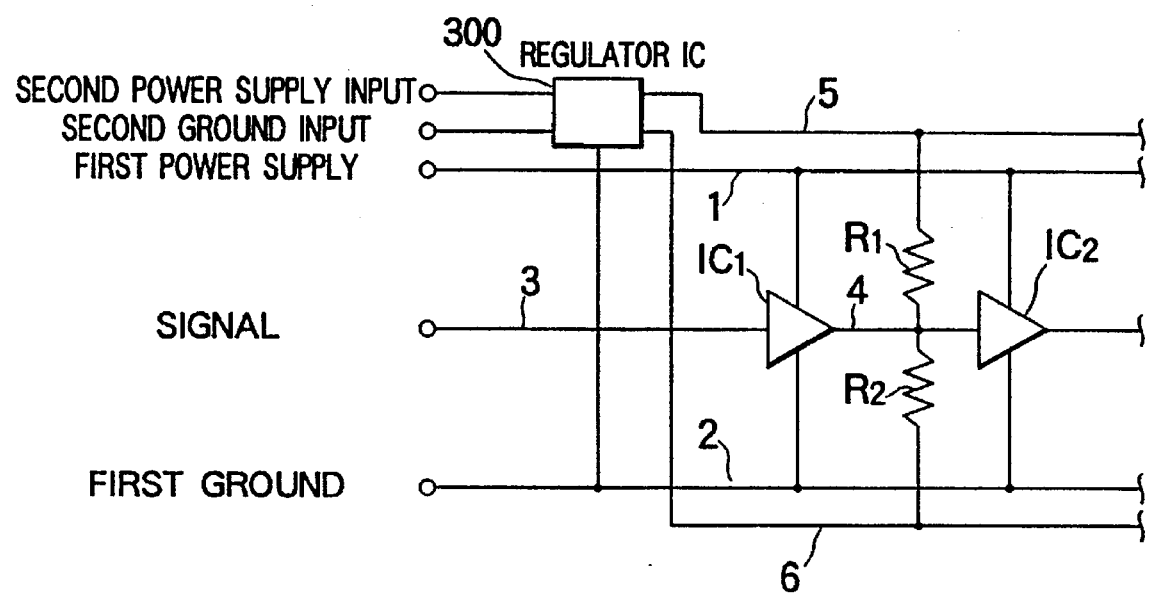
FIG. 11 is a circuit diagram showing a principal portion of another embodiment of the present invention.

In the case of a high power multi-chip module, the second power supply line 5 and the second ground line 6 may be connected to the power output terminal and the ground output terminal of the regulator IC 300 (as shown in FIG. 11), not directly connected to respective outer connection terminals.

In the above-described embodiment, a MCM-C (Multi-Chip Module with Co-fired ceramic substrate) where multilayer substrate is formed by thick film technologies was explained. However, it should be noted that the present invention can be applied to a MCM-L (Laminated PWB) where multilayer substrate has high density interconnections, an MCM-D (Deposited thin film) where multilayer substrate is formed by thin film technologies, and an MCM-D/C ("D" onto "C") where multilayer substrate is formed by both thick film technologies and thin film technologies.

Figure 12:
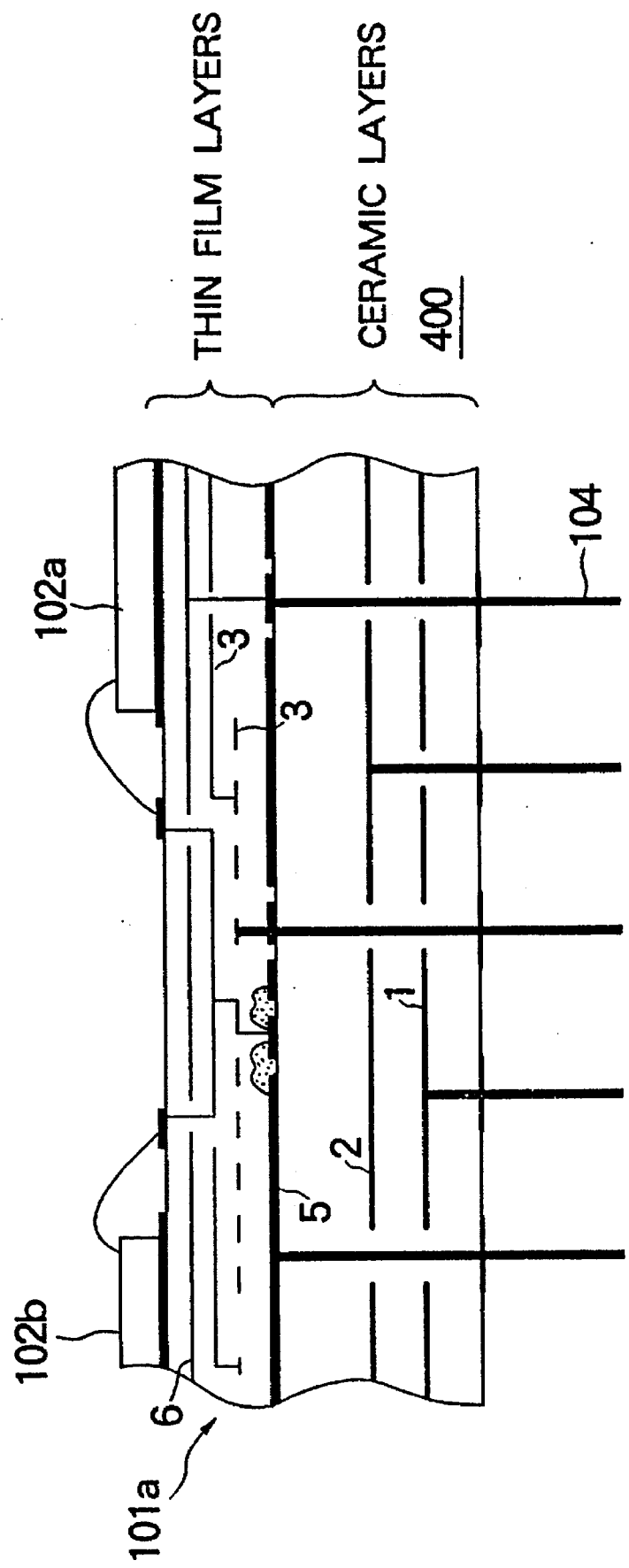
FIG. 12 is a sectional view showing a principal portion of another embodiment of the present invention.

FIG. 12 shows an MCM-D/C according to present invention. In this drawing, a multilayer substrate 101a comprises a plurality of ceramic layers and a plurality of thin film layers. The thickness of the ceramic layers is for example 1 to 3 mm. The thickness of the thin film layers is for example several ten μm. In FIG. 12, the thickness of the thin film layers is relatively enlarged in comparison with the thickness of the ceramic layers.

A first power supply line 1 and a first ground line 2 are formed as the ceramic layers 400. A second power supply line 5, a second ground line 6, X and Y signal lines 3, and so forth are formed as the thin film layers.

Figure 13:
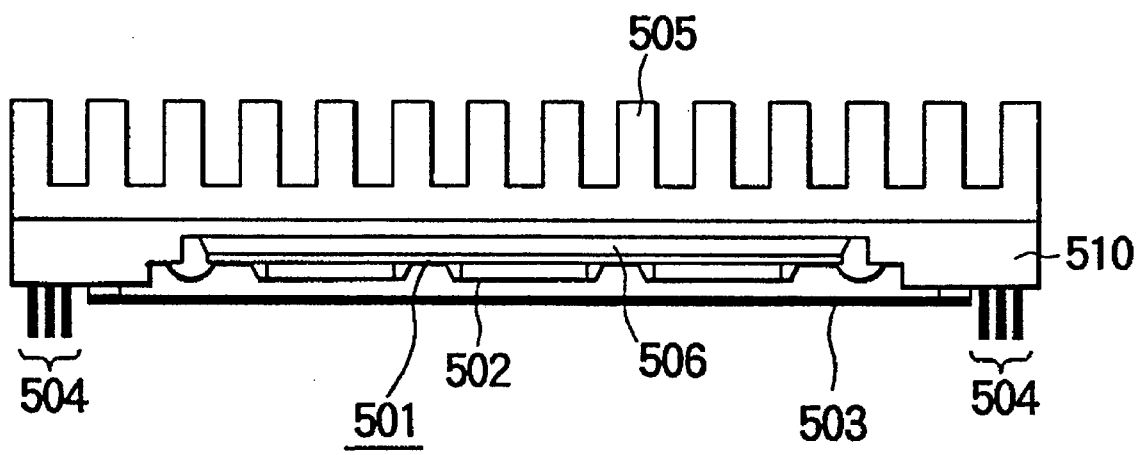
FIG. 13 is a sectional view showing a construction of another embodiment of the present invention.

As shown in FIG. 13, the present invention can be also applied to an MCM-D where a multilayer substrate 501 made of a silicon substrate or the like is separated from a package 510 made of for example ceramic or the like. The multilayer substrate 501 mounted on the package 510 by a electric conductive adhesive 506. In FIG. 13, reference numeral 502 is a semiconductor chip mounted on the multilayer substrate 501. Reference numeral 503 is a lid (sealing cap). Reference numeral 504 represents outer I/O pins. Reference numeral 505 is a heat sink fixed on the package 510.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention. For example, the second power supply line or the second ground line which is not directly connected to the first power supply line or the first ground line may be connected to at least one of the first semiconductor chip and the second semiconductor chip. The second power supply line or the second ground line may be connected to an inner line which directly connects the first semiconductor chip and the second semiconductor chip through respective resistors. In addition, the number of the second semiconductor chips to which signals are input may be two or more.

As described above, according to the multi-chip module of the present invention, since the voltages of the inner lines can be freely designated, a burn-in test can be securely performed for semiconductor chips in a module form.

What is claimed is:

1. A multi-chip module comprising:

a multilayer substrate;

a first semiconductor chip mounted on the multilayer substrate, the first semiconductor chip including a digital signal output terminal, a power input terminal, and a ground terminal;

a second semiconductor chip mounted on the multilayer substrate, the second semiconductor chip including a digital signal input terminal, a digital signal output terminal, a power input terminal, and a ground terminal;

an inner line for connecting the digital signal output terminal of the first semiconductor chip to the digital signal input terminal of the second semiconductor chip;

a first power supply line for supplying first power to the power input terminal of the first semiconductor chip and to the power input terminal of the second semiconductor chip;

a second power supply line for supplying a second power through a resistor to the inner line; and a ground line for supplying a ground potential to the ground terminal of the first semiconductor chip and to the ground terminal of the second semiconductor chip.

2. The multi-chip module as set forth in claim 1, wherein said multilayer substrate is made of ceramic layers, thin film layers, a combination of ceramic layers and thin film layers, or printed wiring boards.

3. The multi-chip module as set forth in claim 1, wherein said second power supply line is directly connected to a dedicated outer connection terminal.

4. The multi-chip module as set forth in claim 1, further comprising:

a regulator semiconductor chip, wherein said second power supply line is connected to a power supply output terminal of said regulator semiconductor chip.

5. A multi-chip module comprising:

a multilayer substrate;

a first semiconductor chip mounted on the multilayer substrate, the first semiconductor chip including a digital signal output terminal, a power input terminal, and a ground terminal;

a second semiconductor chip mounted on the multilayer substrate, the second semiconductor including a digital signal input terminal, a digital signal output terminal, a power input terminal, and a ground terminal;

an inner line connecting the digital signal output terminal of the first semiconductor chip to the digital signal input terminal of the second semiconductor chip;

a power supply line for supplying power to the power input terminal of the first semiconductor chip and to the power input terminal of the second semiconductor chip;

a first ground line for supplying a first ground potential to the ground terminal of the first semiconductor chip and to the ground terminal of the second semiconductor chip; and a second ground line for supplying a second ground potential through a resistor to the inner line.

6. The multi-chip module as set forth in claim 5, wherein said multilayer substrate is made of ceramic layers, thin film layers, a combination of ceramic layers and thin film layers, or printed wiring boards.

7. The multi-chip module as set forth in claim 5, wherein said second ground line is directly connected to a dedicated outer connection terminal.

8. The multi-chip module as set forth in claim 5, further comprising:

a regulator semiconductor chip, wherein said second ground line is connected to a power supply output terminal of said regulator semiconductor chip.

9. A multi-chip module comprising:

a multilayer substrate;

a first semiconductor chip mounted on the multilayer substrate, the first semiconductor chip including a signal output terminal, a power input terminal, and a ground terminal;

a second semiconductor chip mounted on the multilayer substrate, the second semiconductor chip including a signal input terminal, a power input terminal, and a ground terminal;

an inner line connecting the signal output terminal of the first semiconductor chip and the signal input terminal of the second semiconductor chip;

a first power supply line for supplying first power to the power input terminal of the first semiconductor chip and the power input terminal of the second semiconductor chip;

a second power supply line for supplying second power to the inner line through a resistor;

a first ground line for supplying a first ground potential to the ground terminal of the first semiconductor chip and the ground terminal of the second semiconductor chip; and a second ground line for supplying a second ground potential through a resistor to the inner line.

10. The multi-chip module as set forth in claim 9, wherein said multilayer substrate is made of ceramic layers, thin film layers, a combination of ceramic layers and thin film layers, or printed wiring boards.

11. The multi-chip module as set forth in claim 9, wherein said second power supply line and said second ground line are directly connected to respective dedicated outer connection terminals.

12. The multi-chip module as set forth in claim 9, further comprising:

a regulator semiconductor chip, wherein said second power supply line is connected to a power supply output terminal of said regulator semiconductor chip, said second ground line being connected to a ground output terminal of said regulator semiconductor chip.

13. A multi-chip module comprising:

a substrate;

a first semiconductor chip mounted on the substrate, the first semiconductor chip including a digital signal output terminal, a power input terminal, and a ground terminal;

a second semiconductor chip mounted on the substrate, the second semiconductor chip including a digital signal input terminal, a digital signal output terminal, a power input terminal, and a ground terminal;

an inner line connecting the digital signal output terminal of the first semiconductor chip to the digital signal input terminal of the second semiconductor chip;

a first power supply line for supplying first power to the power input terminal of the first semiconductor chip and to the power input terminal of the second semiconductor chip;

a second power supply line for supplying second power to the inner line through a resistor;

a first ground line for supplying a first ground potential to the ground terminal of the first semiconductor chip and to the ground terminal of the second semiconductor chip; and a second ground line for supplying a second ground potential through a resistor to the inner line.

14. The multi-chip module as set forth in claim 13, wherein said multilayer substrate is made of ceramic layers, thin film layers, a combination of ceramic layers and thin film layers, or printed wiring boards.

15. The multi-chip module as set forth in claim 13, wherein said second power supply line and said second ground line are directly connected to respective dedicated outer connection terminals.

16. The multi-chip module as set forth in claim 13, further comprising:

a regulator semiconductor chip, wherein said second power supply line is connected to a ground output terminal of said regulator semiconductor chip.

17. A multi-chip module comprising:

a multilayer substrate;

a first semiconductor chip mounted on the multilayer substrate, the first semiconductor chip including a signal output terminal, a power input terminal, and a ground terminal;

a second semiconductor chip mounted on the multilayer substrate, the second semiconductor chip including a signal input terminal, a power input terminal, and a ground terminal;

an inner line for connecting the signal output terminal of the first semiconductor chip to the signal input terminal of the second semiconductor chip;

a first power supply line for supplying first power of a first potential to the power input terminal of the first semiconductor chip and to the power input terminal of the second semiconductor chip;

a second power supply line for supplying second power of a second potential through a resistor to the inner line, the second potential being greater than the first potential and dropped by the resistor to a value at the inner line substantially equal to the first potential; and a ground line for supplying a ground potential to the ground terminal of the first semiconductor chip and to the ground terminal of the second semiconductor chip.

18. A multi-chip module comprising:

a multilayer substrate;

a first semiconductor chip mounted on the multilayer substrate, the first semiconductor chip including a signal output terminal, a power input terminal, and a ground terminal;

a second semiconductor chip mounted on the multilayer substrate, the second semiconductor including a signal input terminal, a power input terminal, and a ground terminal;

an inner line connecting the signal output terminal of the first semiconductor chip to the signal input terminal of the second semiconductor chip;

a power supply line for supplying power to the power input terminal of the first semiconductor chip and to the power input terminal of the second semiconductor chip;

a first ground line for supplying a first ground potential to the ground terminal of the first semiconductor chip and to the ground terminal of the second semiconductor chip; and a second ground line for supplying a second ground potential through a resistor to the inner line, the second ground potential of the second ground line being less than the first ground potential of the first ground line and dropped by the resistor to a value at the inner line substantially equal to the first ground potential.

19. A multi-chip module as set forth in claim 1, 5, 9, 13, 17, or 18 wherein the resistor controls applied power to the inner line when testing the multi-chip module, and the resistor reduces signal reflection between the first semiconductor chip and the second semiconductor chip during normal operation of the multi-chip module.

20. A multi-chip module as set forth in claim 1, 5, 9, 13, 17, or 18 wherein the resistor controls a characteristic impedance of the inner line during normal operation of the multi-chip module.

21. A multi-chip module as set forth in claim 1, 5, 9, 13, 17, or 18 wherein the resistor shifts an output level of the first semiconductor chip so that an input level of the second semiconductor chip is obtained during normal operation of the multi-chip module.

22. A multi-chip module as set forth in claim 1, 5, 9, 13, 17, or 18 wherein an input signal level of the first semiconductor chip and an input signal level of the second semiconductor chip are substantially equal.

23. A multi-chip module as set forth in claim 1, 5, 9, 13, 17, or 18 wherein the second semiconductor chip is a CMOS chip.

24. A multi-chip module comprising:

a substrate;

a first semiconductor chip mounted on the substrate, the first semiconductor chip including a digital signal output terminal, a power input terminal, and a ground terminal;

a second semiconductor chip mounted on the substrate, the second semiconductor chip including a digital signal input terminal, a digital signal output terminal, a power input terminal, and a ground terminal;

an inner line connecting the digital signal output terminal of the first semiconductor chip to the digital signal input terminal of the second semiconductor chip;

a first power supply line for supplying first power to the power input terminal of the first semiconductor chip and to the power input terminal of the second semiconductor chip;

a second power supply line for supplying second power to the inner line through a resistor, the resistor controlling applied potential to the inner line when testing the multi-chip module, and the resistor terminating the inner line during normal operation of the multi-chip module; and a ground line for supplying a first ground potential to the ground terminal of the first semiconductor chip and to the ground terminal of the second semiconductor chip.

25. The multi-chip module as set forth in claim 24, wherein said multilayer substrate is made of ceramic layers, thin film layers, a combination of ceramic layers and thin film layers, or printed wiring boards.

26. The multi-chip module as set forth in claim 24 wherein said second power supply line is directly connected to a dedicated outer connection terminal.

27. The multi-chip module as set forth in claim 24, further comprising:

a regulator semiconductor chip, wherein said second power supply line is connected to a power supply output terminal of said regulator semiconductor chip.

28. A multi-chip module as set forth in claim 24 wherein the resistor reduces signal reflection between the first semiconductor chip and the second semiconductor chip.

29. A multi-chip module as set forth in claim 24 wherein the resistor shifts an output level of the first semiconductor chip so that an input level of the second semiconductor chip is obtained during normal operation of the multi-chip module.

30. A multi-chip module comprising:

a substrate;

a first semiconductor chip mounted on the substrate, the first semiconductor chip including a signal output terminal, a power input terminal, and a ground terminal;

a second semiconductor chip mounted on the substrate, the second semiconductor including a signal input terminal, a signal output terminal, a power input terminal, and a ground terminal;

an inner line connecting the signal output terminal of the first semiconductor chip to the signal input terminal of the second semiconductor chip;

a power supply line for supplying power to the power input terminal of the first semiconductor chip and to the power input terminal of the second semiconductor chip;

a first ground line for supplying a first ground potential to the ground terminal of the first semiconductor chip and to the ground terminal of the second semiconductor chip; and a second ground line for supplying a second ground potential through a resistor to the inner line, the resistor controlling applied potential to the inner line when testing the multi-chip module, and the resistor terminating the inner line during normal operation of the multi-chip module.

31. The multi-chip module as set forth in claim 30, wherein said multilayer substrate is made of ceramic layers, thin film layers, a combination of ceramic layers and thin film layers, or printed wiring boards.

32. The multi-chip module as set forth in claim 30, wherein said second power supply line is directly connected to a dedicated outer connection terminal.

33. The multi-chip module as set forth in claim 30, further comprising:

a regulator semiconductor chip, wherein said second power supply line is connected to a power supply output terminal of said regulator semiconductor chip.

34. A multi-chip module as set forth in claim 30 wherein the resistor reduces signal reflection between the first semiconductor chip and the second semiconductor chip.

35. A multi-chip module as set forth in claim 30 wherein the resistor shifts an output level of the first semiconductor chip so that an input level of the second semiconductor chip is obtained during normal operation of the multi-chip module.

36. A multi-chip module comprising:

a substrate;

a first semiconductor chip mounted on the substrate, the first semiconductor chip including a signal output terminal, a power input terminal, and a ground terminal;

a second semiconductor chip mounted on the substrate, the second semiconductor chip including a signal input terminal, a power input terminal, and a ground terminal;

an inner line connecting the signal output terminal of the first semiconductor chip to the signal input terminal of the second semiconductor chip;

a first power supply line for supplying first power to the power input terminal of the first semiconductor chip and to the power input terminal of the second semiconductor chip;

a second power supply line for supplying second power to the inner line through a first resistor, the first resistor controlling applied potential to the inner line when testing the multi-chip module, and the resistor terminating the inner line during normal operation of the multi-chip module;

a first ground line for supplying a first ground potential to the ground terminal of the first semiconductor chip and to the ground terminal of the second semiconductor chip; and a second ground line for supplying a second ground potential through a second resistor to the inner line, the second resistor controlling applied potential to the inner line when testing the multi-chip module, and the second resistor terminating the inner line during normal operation of the multi-chip module.

37. The multi-chip module as set forth in claim 36, wherein said multilayer substrate is made of ceramic layers, thin film layers, a combination of ceramic layers and thin film layers, or printed wiring boards.

38. The multi-chip module as set forth in claim 36, wherein said second power supply line is directly connected to a dedicated outer connection terminal.

39. The multi-chip module as set forth in claim 36, further comprising:

a regulator semiconductor chip, wherein said second power supply line is connected to a power supply output terminal of said regulator semiconductor chip.

40. A multi-chip module as set forth in claim 36 wherein the resistors shift an output level of the first semiconductor chip so that an input level of the second semiconductor chip is obtained during normal operation of the multi-chip module.

41. A multi-chip module as set forth in claim 36 wherein the resistors reduce signal reflection between the first semiconductor chip and the second semiconductor chip.

42. A multi-chip module comprising:

a substrate;

a first semiconductor chip mounted on the substrate, the first semiconductor chip including a signal output terminal, a power input terminal, and a ground terminal;

a second semiconductor chip mounted on the substrate, the second semiconductor chip including a signal input terminal, a signal output input terminal, a power input terminal, and a ground terminal;

an inner line connecting the signal output terminal of the first semiconductor chip to the signal input terminal of the second semiconductor chip;

a first power supply line for supplying a first power to the power input terminal of the first semiconductor chip and to the power input terminal of the second semiconductor chip;

a second power supply line for supplying second power through a resistor to the inner line, the resistor controlling applied potential to the inner line when testing the multi-chip module, and the resistor shifting an output level of the first semiconductor chip so that an input level of the second semiconductor chip is obtained during normal operation of the multi-chip module; and a ground line for supplying a ground potential to the ground terminal of the first semiconductor chip and to the ground terminal of the second semiconductor chip.

43. The multi-chip module as set forth in claim 42, wherein said multilayer substrate is made of ceramic layers, thin film layers, a combination of ceramic layers and thin film layers, or printed wiring boards.

44. The multi-chip module as set forth in claim 42, wherein said second power supply line is directly connected to a dedicated outer connection terminal.

45. The multi-chip module as set forth in claim 42, further comprising:

a regulator semiconductor chip, wherein said second power supply line is connected to a power supply output terminal of said regulator semiconductor chip.

46. A multi-chip module comprising:

a substrate;

a first semiconductor chip mounted on the substrate, the first semiconductor chip including a signal output terminal, a power input terminal, and a ground terminal;

a second semiconductor chip mounted on the substrate, the second semiconductor including a signal input terminal, a power input terminal, and a ground terminal;

an inner line connecting the signal output terminal of the first semiconductor chip to the signal input terminal of the second semiconductor chip;

a power supply line for supplying power to the power input terminal of the first semiconductor chip and to the power input terminal of the second semiconductor chip;

a first ground line for supplying a first ground potential to the ground terminal of the first semiconductor chip and to the ground terminal of the second semiconductor chip; and a second ground line for supplying a second ground potential through a resistor to the inner line, the resistor controlling applied potential to the inner line when testing the multi-chip module, and the resistor shifting an output level of the first semiconductor chip so that an input level of the second semiconductor chip is obtained during normal operation of the multi-chip module.

47. The multi-chip module as set forth in claim 46, wherein said multilayer substrate is made of ceramic layers, thin film layers, a combination of ceramic layers and thin film layers, or printed wiring boards.

48. The multi-chip module as set forth in claim 46, wherein said second power supply line is directly connected to a dedicated outer connection terminal.

49. The multi-chip module as set forth in claim 46, further comprising:

a regulator semiconductor chip, wherein said second power supply line is connected to a power supply output terminal of said regulator semiconductor chip.

50. A multi-chip module comprising:

a substrate;

a first semiconductor chip mounted on the substrate, the first semiconductor chip including a signal output terminal, a power input terminal, and a ground terminal;

a second semiconductor chip mounted on the substrate, the second semiconductor chip including a signal input terminal, a power input terminal, and a ground terminal;

an inner line connecting the signal output terminal of the first semiconductor chip to the signal input terminal of the second semiconductor chip;

a first power supply line for supplying first power to the power input terminal of the first semiconductor chip and to the power input terminal of the second semiconductor chip;

a second power supply line for supplying second power to the inner line through a first resistor, the first resistor controlling applied potential to the inner line when testing the multi-chip module, and the first resistor shifting an output level of the first semiconductor chip so that an input level of the second semiconductor chip is obtained during normal operation of the multi-chip module;

a first ground line for supplying a first ground potential to the ground terminal of the first semiconductor chip and to the ground terminal of the second semiconductor chip; and a second ground line for supplying a second ground potential through a second resistor to the inner line, the second resistor controlling applied potential to the inner line when testing the multi-chip module, and the second resistor shifting an output level of the first semiconductor chip so that an input level of the second semiconductor chip is obtained during normal operation of the multi-chip module.

51. The multi-chip module as set forth in claim 50, wherein said multilayer substrate is made of ceramic layers, thin film layers, a combination of ceramic layers and thin film layers, or printed wiring boards.

52. The multi-chip module as set forth in claim 50, wherein said second power supply line is directly connected to a dedicated outer connection terminal.

53. The multi-chip module as set forth in claim 50, further comprising:

a regulator semiconductor chip, wherein said second power supply line is connected to a power supply output terminal of said regulator semiconductor chip.

* * * * *